United States Patent
Uenishi

(10) Patent No.: US 8,638,533 B2
(45) Date of Patent: Jan. 28, 2014

(54) SEMICONDUCTOR DEVICE

(75) Inventor: Akio Uenishi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/486,783

(22) Filed: Jun. 1, 2012

(65) Prior Publication Data

US 2012/0307407 A1 Dec. 6, 2012

(30) Foreign Application Priority Data

Jun. 3, 2011 (JP) .................................. 2011-125448

(51) Int. Cl.
*H02H 9/00* (2006.01)
*H02H 3/20* (2006.01)
*H02H 9/04* (2006.01)

(52) U.S. Cl.
USPC ........................................... 361/56; 361/91.1

(58) Field of Classification Search
USPC ................................... 361/56, 91.1
See application file for complete search history.

(56) References Cited

U.S. PATENT DOCUMENTS

| 2009/0268357 A1* | 10/2009 | Reynders et al. ............... 361/56 |
| 2010/0219448 A1 | 9/2010 | Hara et al. |
| 2010/0302693 A1 | 12/2010 | Hayashi |
| 2012/0092798 A1* | 4/2012 | Hwang ........................ 361/56 |

FOREIGN PATENT DOCUMENTS

| JP | 2010-205808 | 9/2010 |
| JP | 2010-278188 | 12/2010 |

* cited by examiner

*Primary Examiner* — Dharti Patel
(74) *Attorney, Agent, or Firm* — McDermott Will & Emery LLP

(57) ABSTRACT

A semiconductor device includes a first node receiving an external voltage, a second node receiving a grounding voltage, a protection circuit, and a device to be protected coupled in parallel between the first and second nodes, in which the protection circuit includes a lateral IGBT having an emitter coupled to the second node and an avalanche diode having an anode coupled to the collector of the lateral IGBT and a cathode coupled to the first node, and a clamp driving circuit coupled between the first and second nodes, and coupled to the gate of the lateral IGBT.

2 Claims, 16 Drawing Sheets

SEMICONDUCTOR DEVICE

CROSS REFERENCE TO RELATED APPLICATIONS

The disclosure of the Japanese Patent Application No. 2011-125448 filed on Jun. 3, 2011 including the specification, drawings and abstract incorporated herein in reference in its entirety.

BACKGROUND

The present invention concerns a semiconductor device and it particularly relates to a semiconductor device having an ESD (Electro-Static Discharge) protection device circuit for protecting a high voltage integrated circuit inside the semiconductor device against a high voltage.

High ESD withstanding capability has been demanded also to high voltage devices having withstanding voltage of up to about several tens of volts which are used, for example, in semiconductor integrated circuits for power sources or automobiles.

An output device at a rated current of about several amperes can absorb an ESD surge current by the device per se. Accordingly, protection against the surge current can be attained relatively easily. On the other hand, in a small output device or input device, addition of an ESD protection circuit for absorbing and suppressing the surge current is indispensable. Therefore, high ESD protection has been coped with by addition of an external device to the small output device or input device. However, this increase the cost. Accordingly, it has been demanded to incorporate an ESD protection circuit in an integrated circuit for reducing the cost.

By the way, Japanese Patent Laid-Open Publication No. 2010-205808 discloses an invention of using an IGBT (Insulated Gate Bipolar Transistor) having a usual countermeasure for latch up operation in the output stage circuit and using an IGBT in the ESD clamp circuit in which the impurity in a latch up prevention layer is lowered or the impurity concentration is eliminated and which is more tended to cause latch up operation than the output stage circuit device.

Japanese Patent Lai-Open Publication No. 2010-278188 discloses an invention in which an ESD protection circuit comprises a clamp circuit, a zener diode, a double-diffused MOSFET (DMOS), a transistor comprising IGBT, and a resistor.

SUMMARY

While the IGBT is used as the protection device in both of Laid Open Publication Nos. 2010-205808 and 2010-278188, they involve a problem of tending to cause short circuit of a power source when a surge voltage superimposed on a power supply voltage is applied.

Further, in the existent ESD protection circuit, it was necessary to provide a stacked structure of low voltage device for taking compatibility between the breakdown current-voltage characteristic and the surge withstanding capability required for the protection. Therefore, this requires a vertical device structure of using a buried diffusion layer and a deep high concentration diffusion layer to result a problem that the size of the protection device is large for the protection of the high voltage device and the number of processing steps tends to be increased making it difficult to reduce the cost.

Further, when a DC voltage is applied continuously after surge application in a latch up test, the IGBT remains on to result in a problem that the device may possibly be destroyed depending on the voltage value of the DC voltage.

The present invention intends to provide an ESD protection circuit capable of decreasing the area and reducing the manufacturing cost of the ESD protection circuit and preventing device destruction even when a DC current is superimposed by further providing an avalanche diode on the side of a collector region of a horizontal IGBT by PN junction. Further, it intends to provide a semiconductor device including the ESD protection circuit.

According to an aspect of the invention, a semiconductor device includes a first node for receiving an external voltage and a second node for receiving a ground voltage, a protection circuit and a device to be protected coupled in parallel between the first and second nodes, in which the protection circuit includes a lateral IGBT coupled at the emitter thereof to the second node, an avalanche diode coupled at the anode thereof to the collector of the lateral IGBT and coupled at the cathode thereof to the first node, and a clamp driving circuit coupled between the first and second nodes and coupled to the gate of the lateral IGBT.

According to the aspect of the invention, in the semiconductor device, since the avalanche diode is further provided on the side of the collector region of the lateral IGBT by the PN junction, this can reduce the manufacturing cost and prevent destruction of a device to be protected even when the DC current is superimposed. A high performance ESD voltage withstanding can be ensured without increasing the chip area of the semiconductor device and the performance of the semiconductor device can be improved.

DETAILED DESCRIPTION

Figure 1:
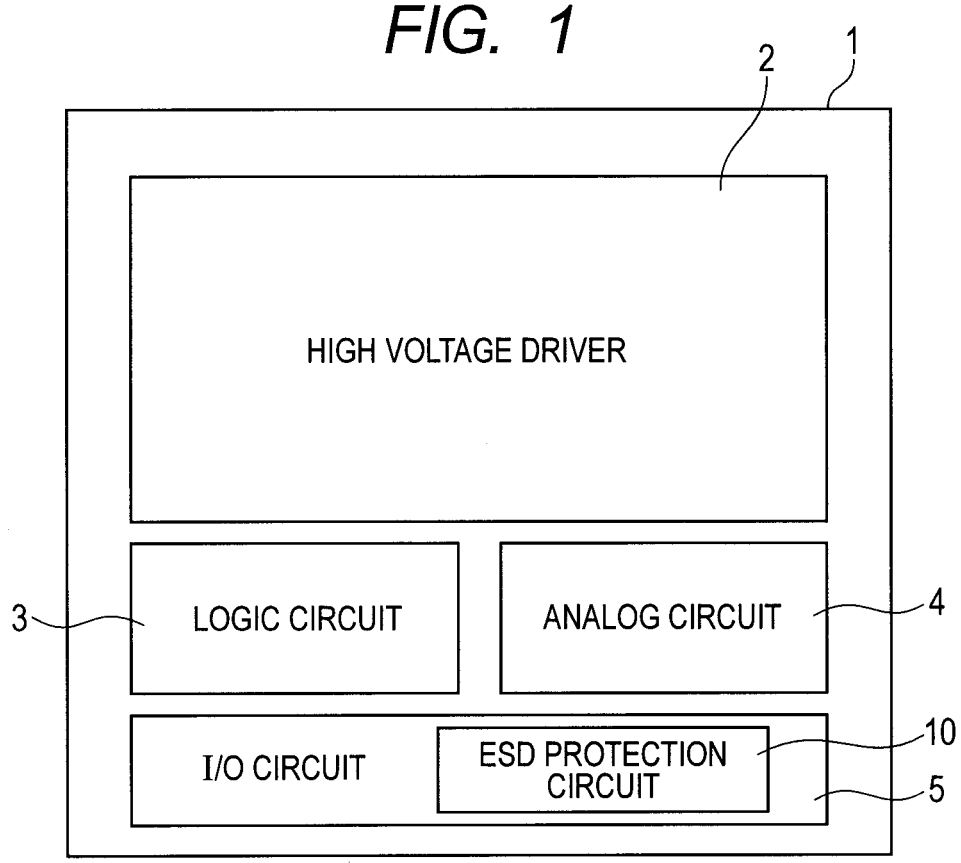
FIG. 1 shows a schematic floor layout of a semiconductor device 1.

The present invention is to be described specifically with reference to the drawings. In the drawings, identical or corresponding portions carry the same reference numerals for which duplicate descriptions are not repeated.

Entire Configuration of Semiconductor Device of Preferred Embodiment

FIG. 1 is a schematic floor layout of a semiconductor device 1. Referring to FIG. 1, a semiconductor device 1 includes a high voltage driver 2, a logic circuit 3, an analog circuit 4, and an I/O circuit 5. The I/O circuit further includes an ESD protection circuit 10.

As a high voltage driver, a high voltage driver, for example, used for PDP (Plasma Display Panel) and LCD (Liquid Crystal Display) may be considered. The high voltage driver 2, the logic circuit 3, the analog circuit 4, etc. are protected by the ESD protection circuit 10 against ESD surge voltage.

First Embodiment

Figure 2:
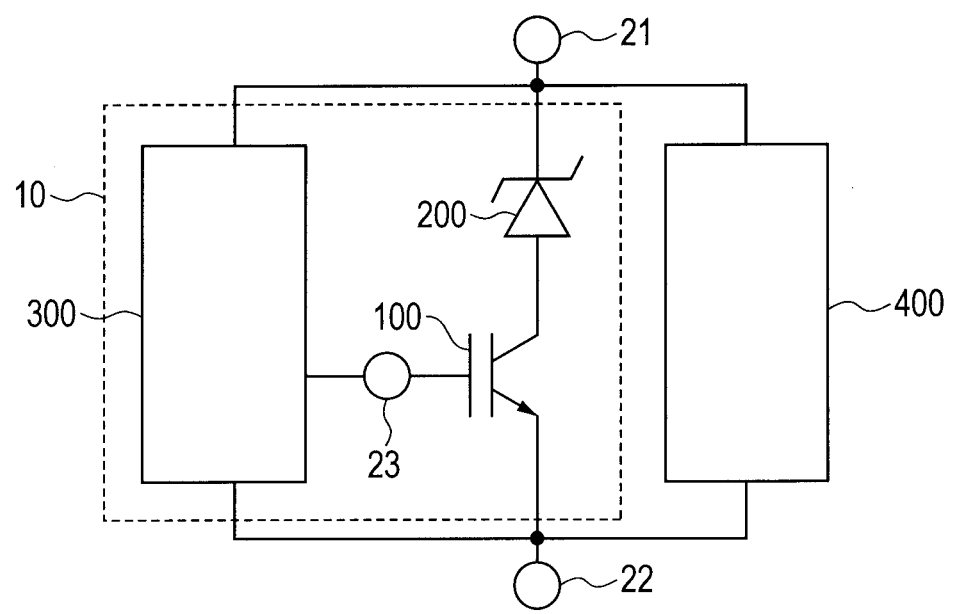
FIG. 2 is a circuit diagram schematically showing an ESD protection circuit included in the semiconductor device.

FIG. 2 is a circuit diagram schematically showing the ESD protection circuit 10 included in the semiconductor device 1. The ESD protection circuit 10 is provided on every terminal of the semiconductor device 1. The ESD protection circuit 10 for one terminal is to be described herein.

Referring to FIG. 2, an ESD protection circuit 10 includes a lateral IGBT 100, an avalanche diode 200, a gate drive circuit 300, and a device 400 to be protected (hereinafter also referred to as a protected device).

The protected device 400 is coupled between the terminal 21 and a grounding terminal 22 as input/output. The anode of the avalanche diode 200 is coupled in series to the lateral IBGT 100 on the side of the collector terminal. Further, the cathode of the avalanche diode 200 is coupled to the terminal 21, and the emitter electrode 12 of the lateral IGBT 100 is coupled to the grounding terminal 22. The gate electrode of the lateral IGBT 100 receives an output from the gate drive circuit 300.

The gate drive circuit 300 supplies a voltage to the node 23 and applies the voltage to the gate of the lateral IBGT 100 when the voltage supplied to the terminal 21 is at an overvoltage. By the voltage application, the lateral IGBT 100 turns on and a breakdown current flows from the terminal 21 to the grounding terminal 22 by way of the avalanche diode 200. Thus, the voltage at the terminal 21 is kept in an appropriate state.

For preventing the destruction of the device also in a case where a DC current is superimposed, the avalanche diode 200 has a breakdown voltage at about a power supply voltage. The configuration of the avalanche diode 200 is not restricted to that of the diode due to a PN junction as will be described later but the configuration can be attained also by a diode-connected transistor. For example, a GGNMOS (Gate-grounded NMOS) can be used.

For the use of 12 V power source, considering that the hold voltage of the lateral IGBT is about several volts, GGNMOS by a stack of 1 to 2 stages can be used as a substitute. The chip area in this case remains an increase of about 2 to 3 times compared with a chip area of the lateral IGBT 100. The lateral IGBT 100 has configuration of only GGNMOS to obtain a withstanding voltage of about 40 V, while the chip area can be decreased. When GGPMOS (Gate-grounded PMOS) is used, a high hold voltage can be attained. However, the clamp resistance is high and it is difficult to control the breakdown voltage at high current. Further since the destruction current per se is small, it is necessary to increase the channel width and decrease the chip area is difficult.

Figure 3:
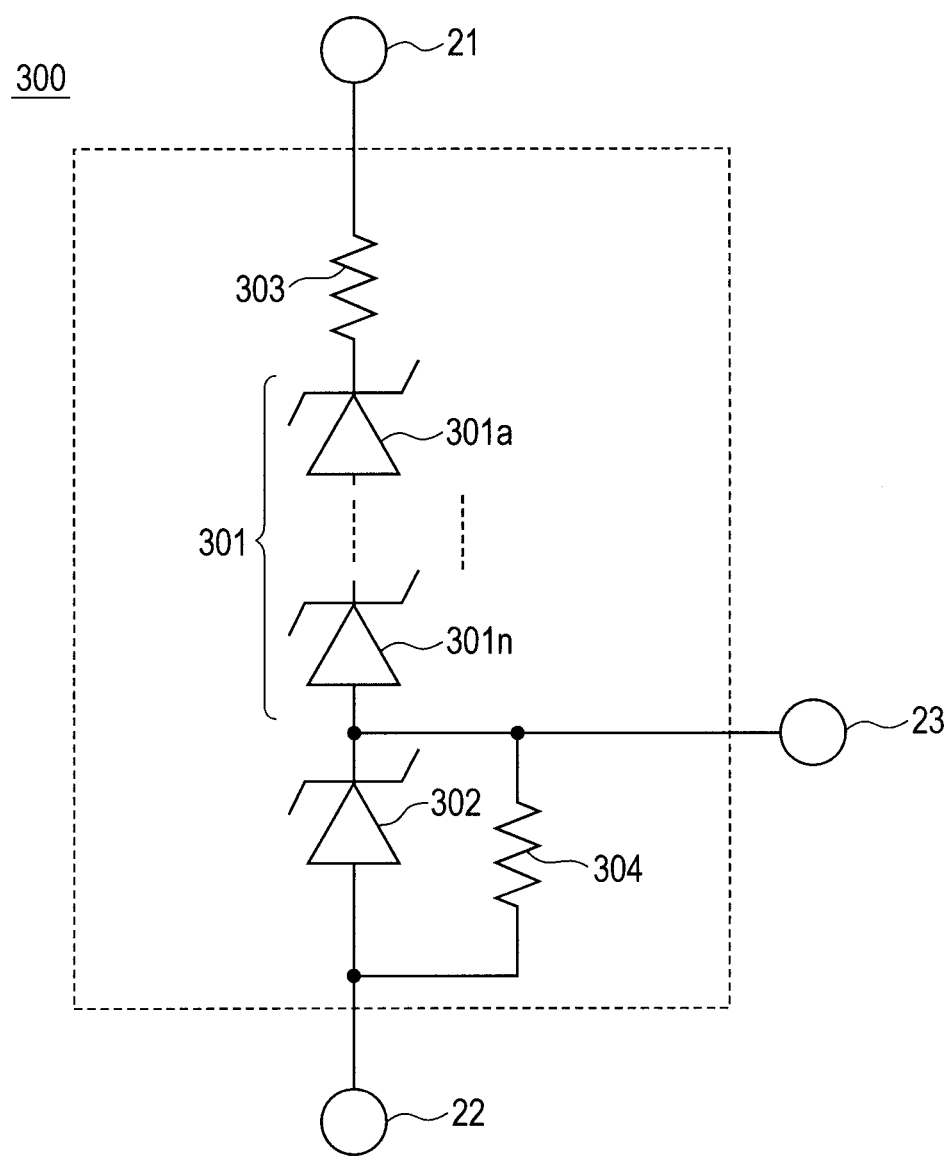
FIG. 3 is a schematic circuit diagram of a gate drive circuit.

FIG. 3 is a schematic circuit diagram for a gate drive circuit 300. Referring to FIG. 3, the gate drive circuit 300 is coupled between the terminal 12 and the grounding terminal 22 in the same manner as other devices. The control output is coupled to the gate electrode 13 of the lateral IGBT 100.

The gate drive circuit 300 includes an avalanche diode group 301 for adjusting a protection voltage, a gate protection avalanche diode 302, a limiting resistor 303, and a discharge resistor 304.

The avalanche diode group 301 for adjusting the protection voltage further includes a plurality of avalanche diodes 301a, ..., and 301n. When an overvoltage is applied to the terminal 21, the avalanche diode group 301 for adjusting the protection voltage is put to a conduction state by avalanche breakdown of the avalanche diodes 301a ..., and 301n included in the avalanche diode group 301 for adjusting the protection voltage. Thus, the gate electrode of the lateral IGBT 100 receives a signal at an H level and the lateral IGBT 100 turns on. In this case, a current flows from the terminal 21 applied with the overvoltage to the grounding terminal 22 by way of the lateral IGBT 100, and the protected device 400 is protected against the overvoltage.

However, since the lateral IGBT 100 is destroyed when the voltage received on the node 23 is excessively high, a gate protection avalanche diode 302 is provided for the protection. Specifically, when the voltage supplied to the node 23 is high, the gate protection avalanche diode 302 is put to avalanche breakdown to flow a current to the grounding terminal 22. Thus a high voltage that may possibly destroy the lateral IGBT 100 is not applied to gate electrode 13 of the lateral IGBT 100 and the lateral IGBT 100 turns on/off depending on the state of the overvoltage on the terminal 21.

The limiting resistor 303 is provided so as not to flow an overcurrent to the avalanche diode group 301 for adjusting the protection voltage. Further, the discharge resistor 304 is provided so that the voltage on the gate electrode 13 of the lateral IGBT 100 is not in a floating state when the overvoltage is not applied to the terminal 21.

Figure 4:
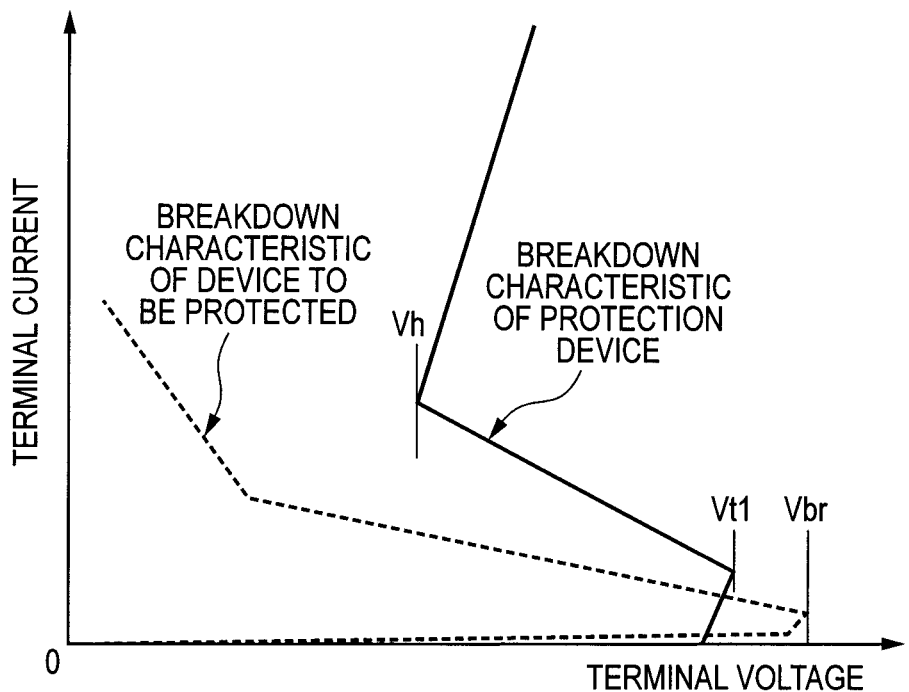
FIG. 4 is a graph for explaining an electric characteristic of the ESD protection circuit.

FIG. 4 is a graph for explaining the electric characteristic of the ESD protection circuit 10. Referring to FIG. 4, abscissa represents a collector voltage Vc and the ordinate represents a collector current Ic flowing through the avalanche diode 200 and the lateral IGBT 100. The breakdown characteristic of the ESD protection circuit 10 and that of the protected device 400 are shown by a solid line and a broken line respectively. With a view point of protecting the protected device 400 against the overvoltage, the trigger voltage Vt1 in the breakdown characteristic of the ESD protection circuit 10 is set to a voltage lower than the breakdown voltage Vbr in that of the protected device 400.

The hold voltage Vh in the breakdown characteristic of the ESD protection circuit 10 is set to a voltage higher than the voltage at the upper limit generated in the usual circuit operation such as switching of a high voltage device including the power supply voltage of the protected device.

As described above, setting the breakdown characteristic of the ESD protection circuit 10 can put the ESD protection circuit 10 to a breakdown state at a voltage lower than that of the protected device 400 when an overvoltage is applied to the terminal 21. The ESD protection circuit 10 is put to the conduction state, so that the overvoltage can be discharged from the grounding terminal 22 and the protected device 400 can thus be protected.

On the other hand, since the hold voltage Vh is at a voltage higher than the voltage at the upper limit of the protected device 400, the lateral IGBT 100 does not turn on in the usual operation and the protected device 400 can perform an appropriate operation.

The breakdown voltage of the avalanche diode 200 is set to a high voltage equal with or higher than the power supply voltage. The breakdown voltage of the lateral IGBT 100 is set to higher than the operation voltage of the gate drive circuit 300, that is, the total of the breakdown voltage of the avalanche diode group 301 for adjusting the protection voltage and the breakdown voltage of the gate protection avalanche diode 302.

Figure 5:
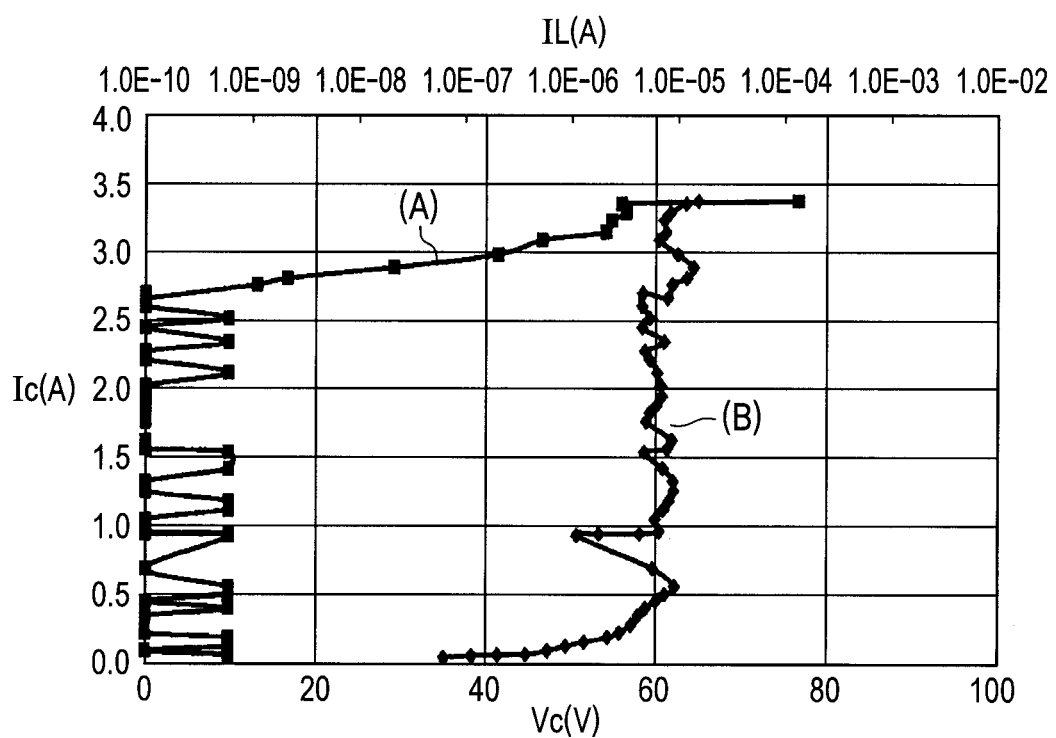
FIG. 5 is a graph showing a voltage-current characteristic of ESD protection circuit by TLP (Transmission Line Pulse) measurement.

FIG. 5 is a graph showing a voltage-current characteristic of ESD protection circuit by TLP (Transmission Line Pulse) measurement. Referring to FIG. 5, the ordinate represents a collector current Ic, the abscissa represents a leak current I1 in the upper stage and a collector voltage Vc in the lower stage of the abscissa.

Graph (A) shows a leak characteristic. On the other hand, graph (B) shows a collector current Ic-collector voltage Vc characteristic. Referring to the graphs (A) and (B), when the collector voltage Vc increases to a voltage of 40 V or higher, the ESD protection circuit 10 starts operation. Then, when the collector voltage Vc increases to an overvoltage of about 60 V the circuit is put to the breakdown state, and the voltage is lowered to about 50 V (hold voltage Vh) due to the conduction state (snap back state). Further, the voltage again increases to about 60 V.

Before generation of a leak current, the lateral IGBT 100 is in the breakdown state. Accordingly, while a surge current is supplied, the stress thereof is not applied to the protected device 400. That is, the protected device 400 is not yet put to device destruction in this stage.

The lateral IGBT 100 can withstand the ESD surge at high current density and high breakdown voltage, and low clamp resistance by the sustain operation.

Then, when the contact current Ic reaches about 2.5 A and the collector voltage Vc reaches about 65 V, the leak current increases abruptly. This is a phenomenon that is caused by the destruction of the protected device 400 by the leak current.

Thus, when the breakdown voltage of the protected device 400 is about 70 V or higher, the protected device 400 can be protected sufficiently by the ESD protection circuit 10 even when the application voltage is at about 4 kV in an HBM (Human-Body-Model) at a discharge resistance of 1.5KΩ and a discharge capacitance of 100 pF.

The measurement described above can be attained easily by applying a pulse at 100 ns to the ESD protection circuit 100 and measuring the voltage-current characteristic by using a TLP tester. In this case, the lateral IGBT has an effective area of 3500 μm$^2$ and a channel length of 180 μm.

Further, since the breakdown voltage of the lateral IGBT 100 is an extremely high voltage when compared, for example, with that of the GGNMOS and it does not increase the chip area or increase the clamp resistance by the stacked configuration as in the GGNMOS for the purpose of protecting the protected device 400.

Second Embodiment

Figure 6:
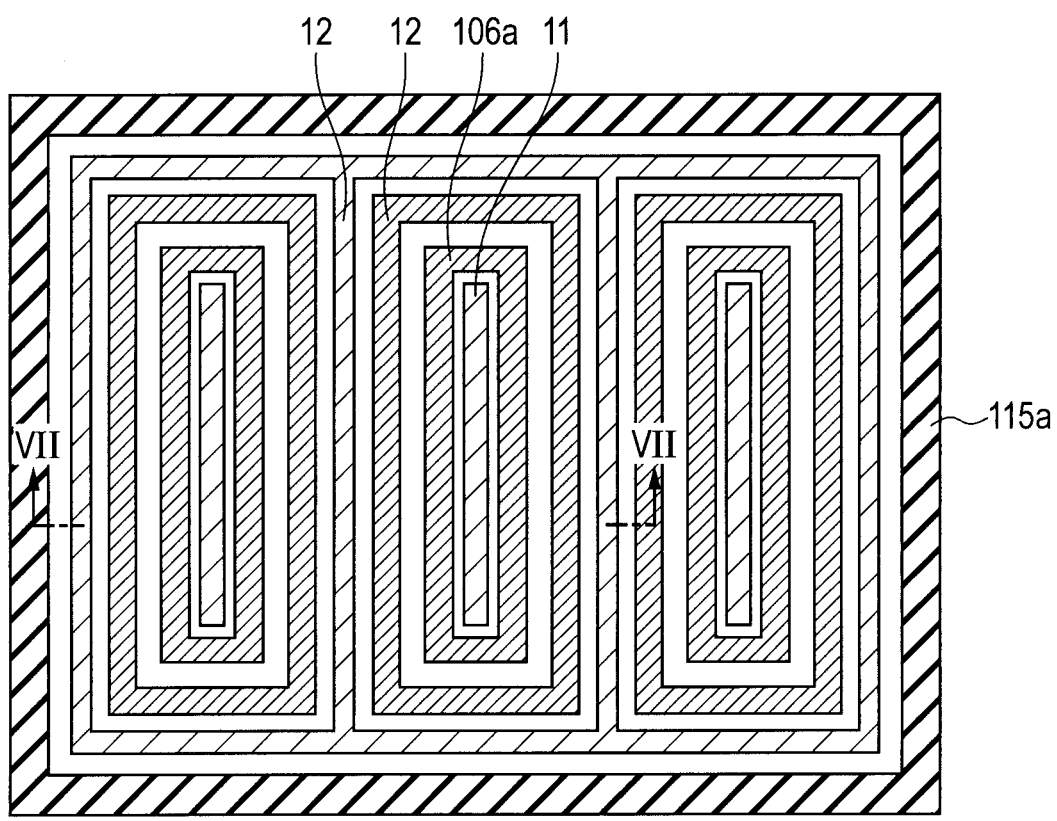
FIG. 6 is a plan view of a lateral IGBT and an avalanche diode according to a second embodiment.
Figure 7:
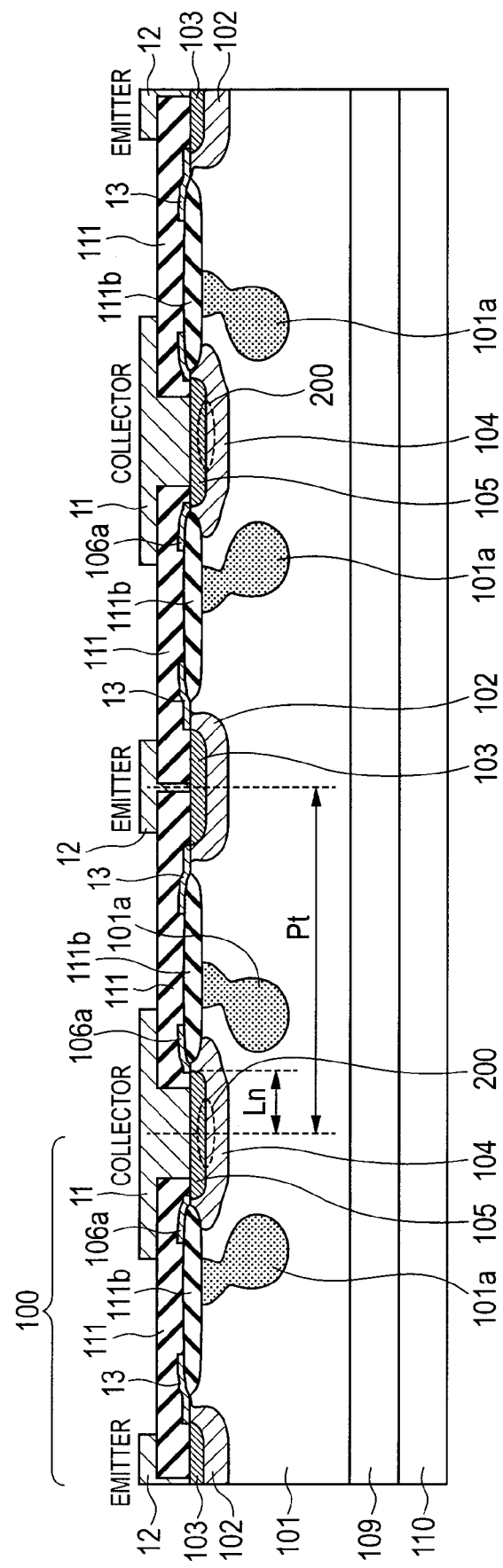
FIG. 7 is a cross sectional view along a cross sectional line VII-VII shown in FIG. 6 in the second embodiment.
Figure 8:
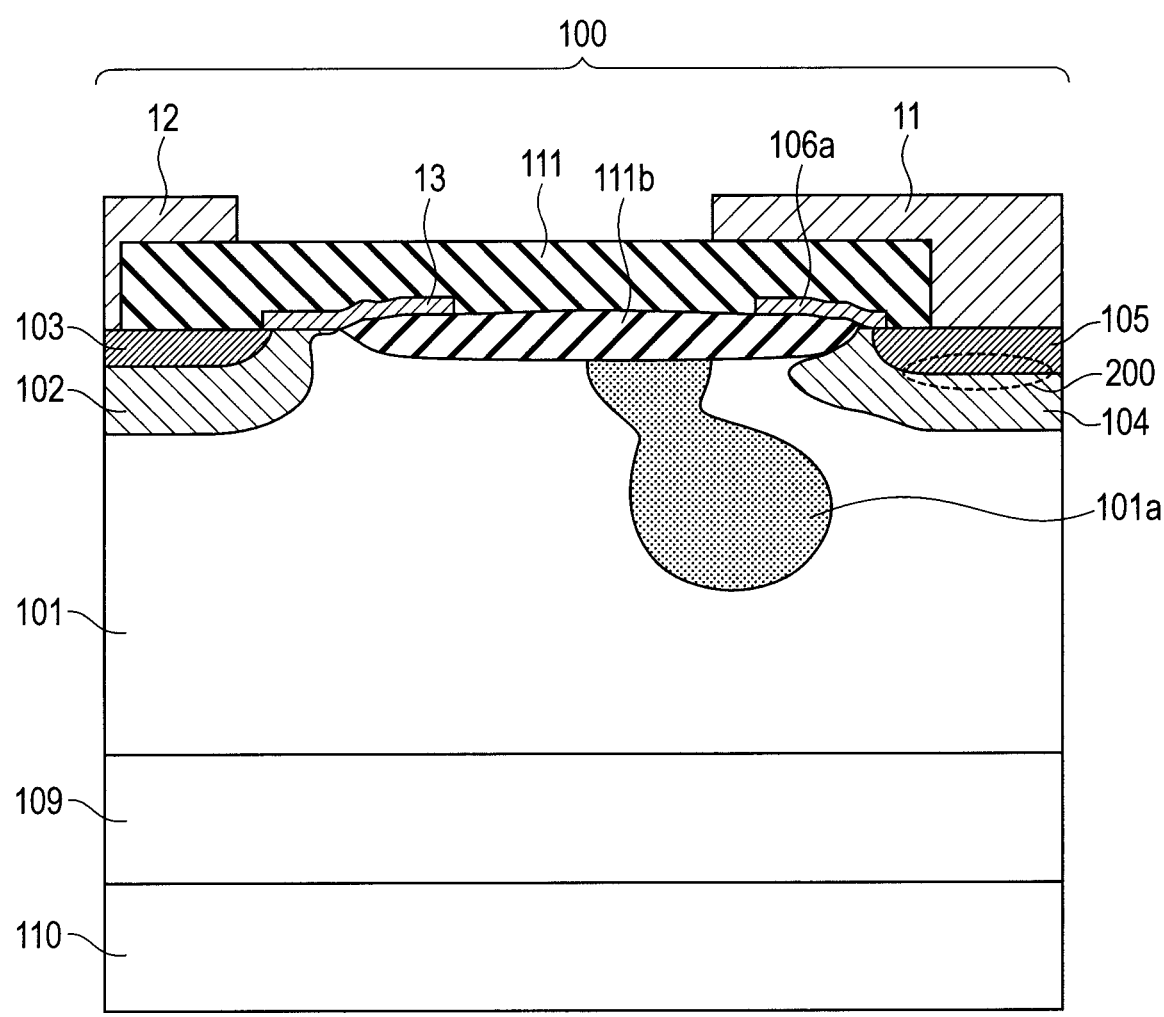
FIG. 8 is an enlarged view for the cross sectional view shown in FIG. 7 in the second embodiment.

FIG. 6 is a plan view of a lateral IBGT 100 and an avalanche diode 200 according to a second embodiment. FIG. 7 is a cross sectional view along cross sectional line VII-VII shown in FIG. 6 in the second embodiment. FIG. 8 is an enlarged cross sectional view for FIG. 7 in the second embodiment.

Referring to FIG. 6, a gate electrode 106a is disposed so as to surround a collector electrode 11, and a gate electrode 13 is disposed so as to further surround the gate electrode 106a. Further, an emitter region is disposed so as to surround the gate electrode 13. An emitter electrode 12 is used in common with emitter electrodes of other lateral IBTs and is at a potential identical therewith. A trench isolation insulating film 115a for device isolation of the lateral IGBT is disposed so as to further surround the emitter electrode 12.

Referring to FIG. 7 and FIG. 8, the structural view of the lateral IBGT including an avalanche diode shows an example of a configuration where the avalanche diode 200 is integrated in the collector region of the lateral IGBT 100.

Description is to be made herein for an N channel type lateral IGBT of an SOI (Silicon On Insulator) structure. An N-epitaxial layer 101 is over a silicon support substrate 110 formed by way of a buried oxide film 109.

While the description is to be made to the lateral IGBT of the SOI structure, this is not restrictive and, for example, a bulk substrate can also be used.

An N channel type lateral IGBT 100 is formed. A P well 104 is formed as a collector region of the lateral IGBT 100 from the surface of the N-epitaxial layer 101 to a predetermined depth. A junction face between the P well 104 and the N-epitaxial layer 101 is a PN junction face. A LOCOS (Local Oxidation of Silicon) oxide film 111b is formed to the surface of the N-epitaxial layer 101 so as to surround the periphery of the P well 104.

A P well 102 is formed from the surface of the N-epitaxial layer 101 to a predetermined depth so as to surround an N$^+$ diffusion layer 103 on the side and the bottom thereof. The P well 102 is formed such that the surface of the N-epitaxial layer 101 is exposed between the P well 102 and the LOCOS oxide film 111b. Thus, the N$^+$ diffusion layer 103 as the emitter region is isolated from the N-epitaxial layer 101 by way of the P well 102.

The gate electrode 13 is formed over the region of the P well 102 put between the N$^+$ diffusion layer 103 and the N-epitaxial layer 101 by way of a gate insulating film (not illustrated). The gate electrode 13 is formed so as to cover from the region of the P well 102 to the outer peripheral portion of the LOCOS oxide film 111b.

On the other hand, the gate electrode 106a is formed so as to cover from the region of the P well 104 to the outer peripheral portion of the LOCOS oxide film 111b. The gate electrode 106a is restricted to be within a range between the potential of the terminal 21 and the potential of the P well 104 as the collector region, thereby preventing channel leak at the surface of the diffusion junction. The gate electrode 106a is not fixed for the potential to the range described above but may be formed as a floating electrode.

An interlayer insulating film 111 is formed so as to cover the N-epitaxial layer 101 and the LOCOS oxide film 111b of the device forming region. A collector electrode 11 electrically coupled with the P well 104 is formed over the interlayer insulating film 111. Further, an emitter electrode 12 electrically coupled to the $N^+$ diffusion layer 103 and the P well 102 is formed.

By the PN junction between the P well 104 and the $N^+$ diffusion layer 105 as the collector region, an avalanche diode 200 formed in a direction opposing the direction of the flow of the collector current and having a breakdown voltage of about 10 V is included.

In the lateral IGBT 100, when a voltage at or higher than the predetermined threshold voltage is applied to the gate electrode 13, a channel is formed in a region of the P well 102 situated just below the gate electrode 13 and electrons are injected from the $N^+$ diffusion layer 103 as the emitter region by way of the channel to the N-epitaxial layer 101. When the electrons are injected and accumulated in the N-epitaxial layer 101, a forward bias is applied to the PN junction face between the P well 104 as the collector region and the N-epitaxial layer 101 and holes as minor carriers are injected from the P well 104 to the N-epitaxial layer 101.

Thus, a phenomenon so-called conductivity modulation occurs in the N-epitaxial layer 101, in which the resistance value of the N-epitaxial layer 101 is lowered to attain an on state where conduction is possible between the $N^+$ diffusion layer 103 as the emitter region and the P well 104 as the collector region.

Further, by locating an N buffer region 101a nearer to the collector region than the emitter region, the breakdown voltage and the sustain voltage of the avalanche diode formed from the PN junction between the P well 104 and the $N^+$ diffusion layer 105 can be controlled.

While the description has been made to the N channel type lateral IGBT in the lateral IGBT of the SOI structure described above, the invention is applicable also to a P channel type lateral IGBT.

Figure 9:
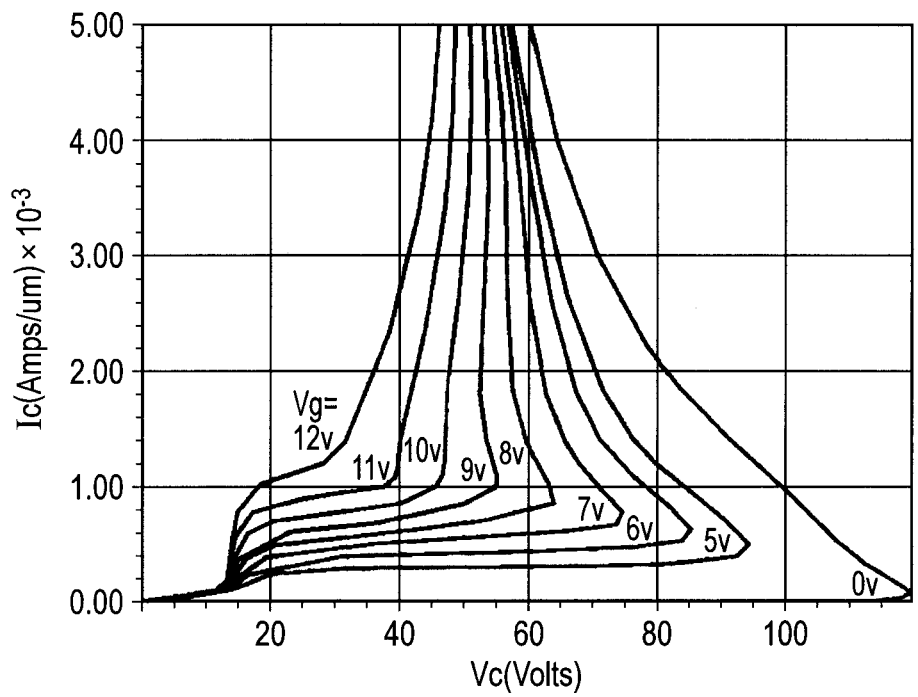
FIG. 9 is a graph showing the result of device simulation in the second embodiment.

FIG. 9 is a view showing the result of device simulation for the second embodiment. FIG. 9 shows a relation of: collector current Ic-collector voltage Vc when the gate voltage is swept from 0 to 12 V. The ordinate represents the collector current Ic and the abscissa represents the collector voltage Vc. The effect of temperature increase due to current supply is not taken into consideration in the simulation.

In a case where the gate voltage Vg is applied sufficiently at about 10 V, when the voltage applied from the node 23 reaches about 13.0 V (the voltage is referred to as Va), the collector current Ic flows. The value of the collector current Ic is saturated at about 0.6 mA/μm.

On the other hand, when the voltage supplied from the node 23 increase to about 40 V or higher, the collector current Ic increases abruptly. The collector current Ic starts to flow by the voltage Va due to the breakdown characteristic of the avalanche diode formed in the collector region.

Figure 10:
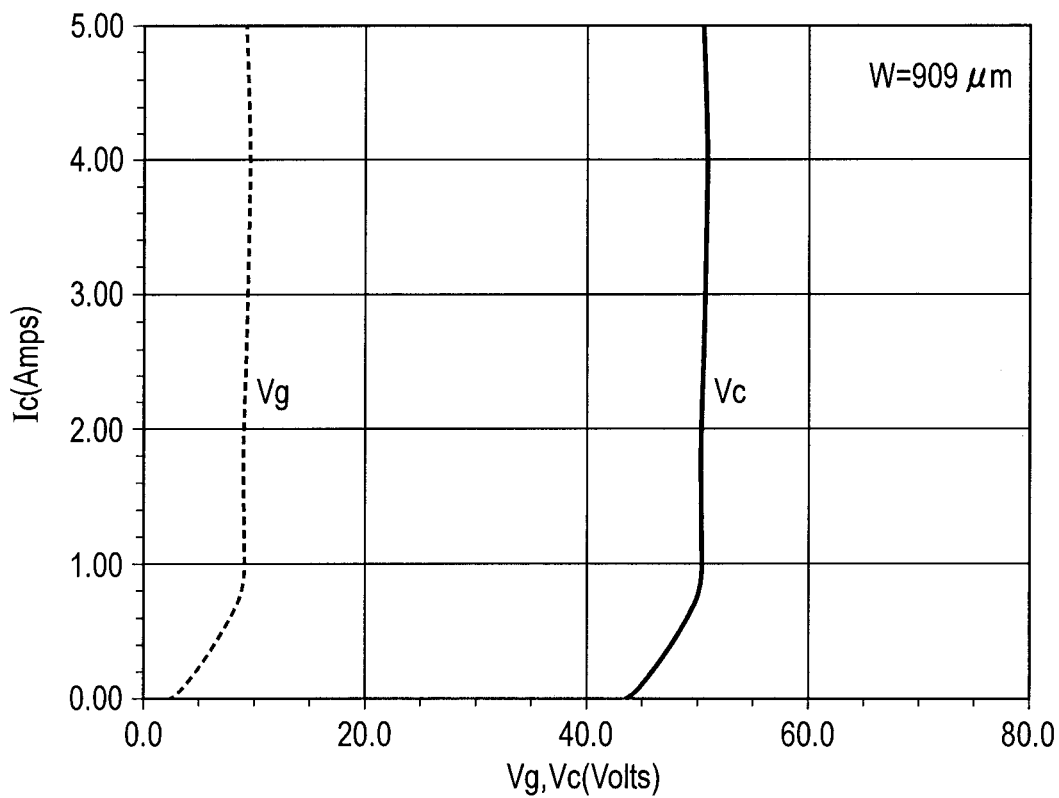
FIG. 10 is a graph showing the result of the device simulation including a gate drive circuit 300 in the second embodiment.

FIG. 10 is a graph showing the result of device simulation including the gate drive circuit 300 in the second embodiment. It is set such that the total gate width (Wt) of IGBT 100 is 909 μm, the breakdown voltage of the avalanche diode group 301 for adjusting the protection voltage is 40 V, and the breakdown voltage of the gate protection avalanche diode 302 is 10 V. The total gate width (Wt) is a gate width of the gate electrode 13 on the side of the emitter electrode 12. That is, the gate width is a total of the current flowing regions between the collector electrode 11 and the emitter electrode 12. In one device, the gate electrode 13 is present each by one on both sides of the collector electrode 11. Accordingly, for the entire device, the total gate width is a length of the gate width utilizing one device having the repeating structure multiplied by the number of the gate electrodes (two). The effect of temperature increase due to current supply is not taken into consideration in the simulation.

Referring to FIG. 10, when the voltage supplied to the node 23 is at about 40 V or lower, the collector current Ic flows scarcely. On the other hand, in the protected device 400, the voltage in the range of about 40 V has no effect on the operation of the protected device 400.

For example, even in a case where a high current of about 5 A flows in the ESD protection circuit 10, since the gate drive circuit 300 conducts clamp operation at about 50 V, the protected device 400 can be protected sufficiently also in an HBM at about 8 kV.

When it is intended to obtain the same effect by using a GGNMOS having a breakdown voltage of 10 V, it is necessary for a GGNMOS to have a structure stacked by four stages in order to obtain a breakdown voltage of 40 V and a gate width W of about 500 μm is necessary for flowing a current of 5 A in the existent case. Accordingly, about 2000 μm of the total gate width Wt is necessary.

However, the distance between the collector electrode 11 and the emitter electrode 12 of the lateral IGBT on the SOI substrate can be about 10 μm assuming the breakdown voltage as 100 V. Even when the avalanche diode is incorporated in the collector region, this can be coped with by increasing the distance only of about 2 to 3 μm.

Further, the distance between the collector electrode 11 and the emitter electrode 12 is substantially equal with the transistor size of 5 V type GGNMOS. Since the gate drive circuit 300 consumes little power and can be formed with a small area, the ESD protection circuit shown in the second embodiment can be attained with an area substantially one-half area of the GGNMOS stack structure.

An example of a method of manufacturing a lateral IGBT 100 and the avalanche diode 200 integrally according to the second embodiment is to be described briefly. FIG. 11 to FIG. 20 are views for explaining a portion of such a manufacturing method of the second embodiment. In the same manner as in FIG. 6 to FIG. 8, manufacturing steps of the N channel type lateral IGBT 100 and the avalanche diode 200 of the SOI structure are to be simply described particularly for the steps after the step of forming the N-epitaxial layer 101. In FIG. 11 to FIG. 20, the silicon support substrate 110 and the buried oxide film 109 over the substrate are not illustrated. While the method is to be explained for the lateral IGBT of the SOI structure, this is not restrictive but, for example, a bulk substrate may also be used.

Figure 11:
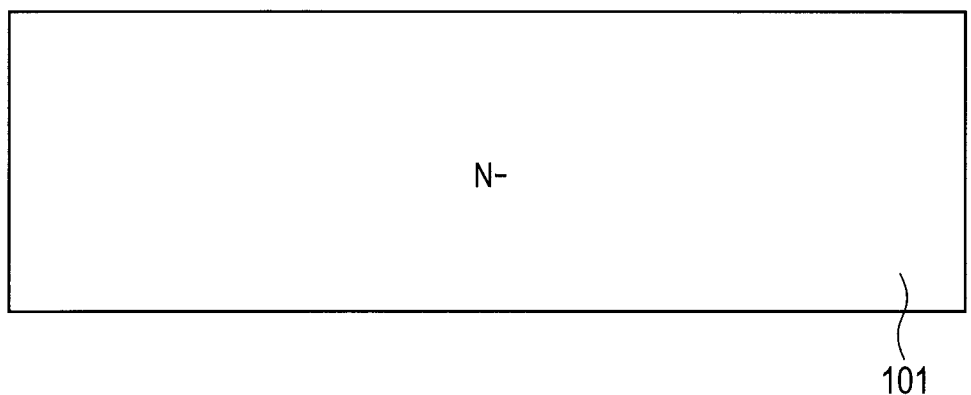
FIG. 11 is a view for explaining a portion of a manufacturing method according to the second embodiment.

Referring to FIG. 11, an N-epitaxial layer 101 is formed at first over a semiconductor substrate. The N-epitaxial layer may also be formed by interposing a buried oxide film 109 over the support substrate by an SOI process utilizing bonding.

Figure 12:
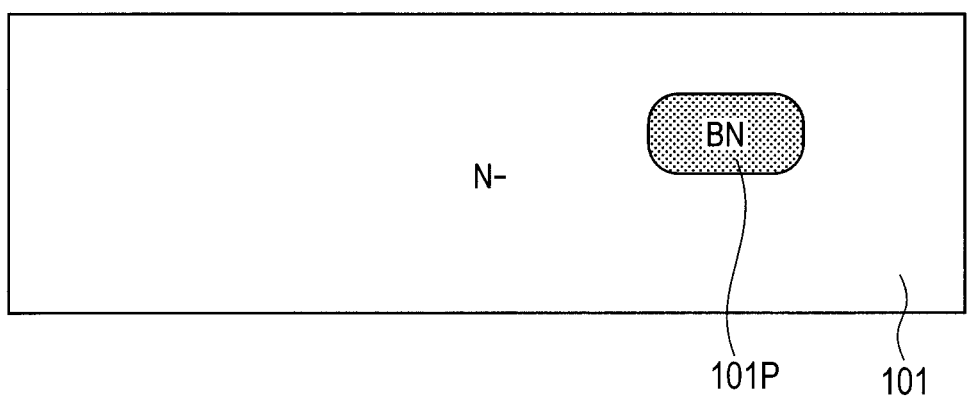
FIG. 12 is a view for explaining a portion of a manufacturing method according to the second embodiment.

Referring to FIG. 12, a bottom N well 101P is formed from the surface of the N-epitaxial layer 101 to a predetermined depth.

Figure 13:
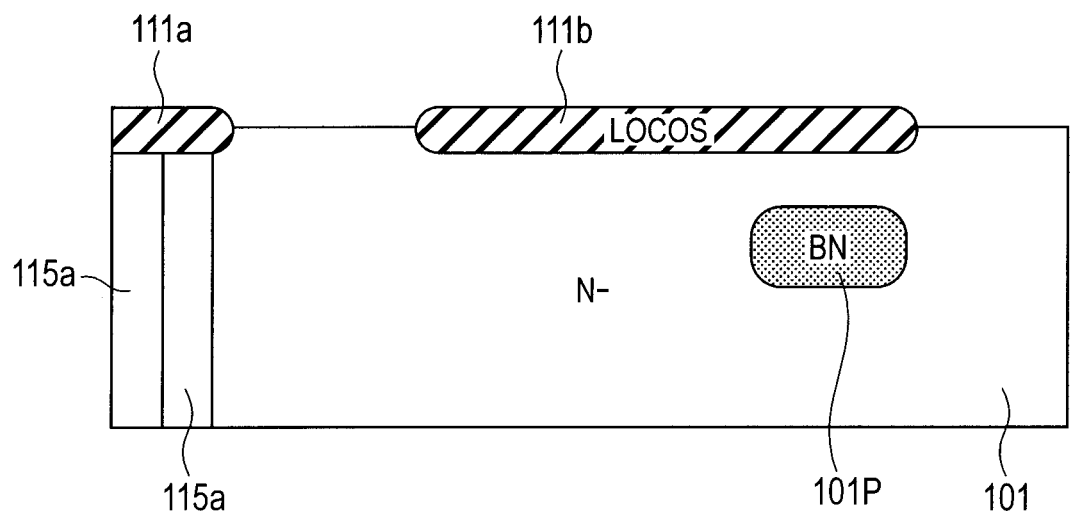
FIG. 13 is a view for explaining a portion of a manufacturing method according to the second embodiment.

Referring to FIG. 13, a trench for exposing a trench isolation insulating film 115a is formed in the N-epitaxial layer 101, and a predetermined trench isolation insulating film 115a is formed in the trench. Thus, a device forming region partitioned by the trench isolation insulating film 115a is formed in the N-epitaxial layer 101. At the same time, a LOCOS oxide film 111b is formed for a predetermined region in the N-epitaxial layer 101.

Figure 14:
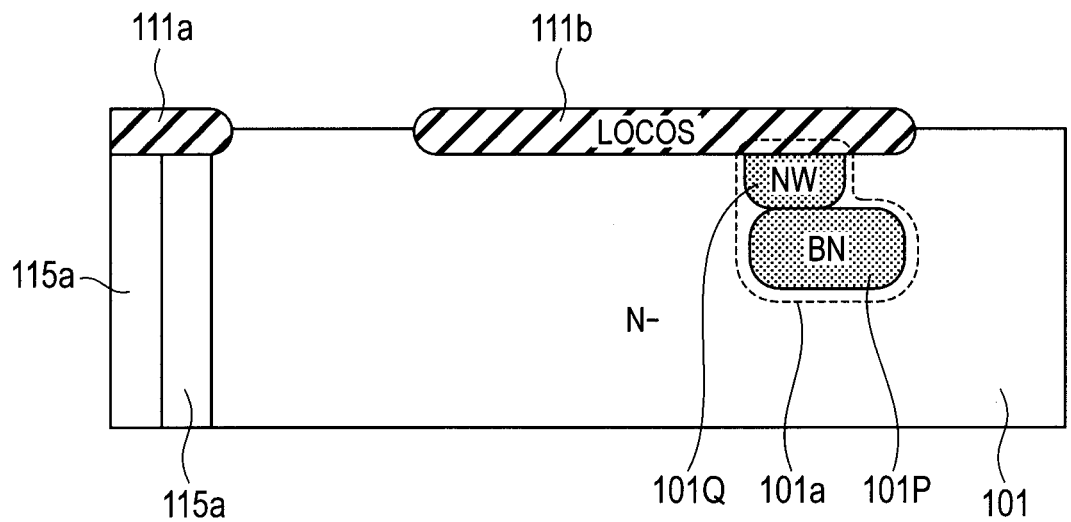
FIG. 14 is a view for explaining a portion of a manufacturing method according to the second embodiment.
Figure 15:
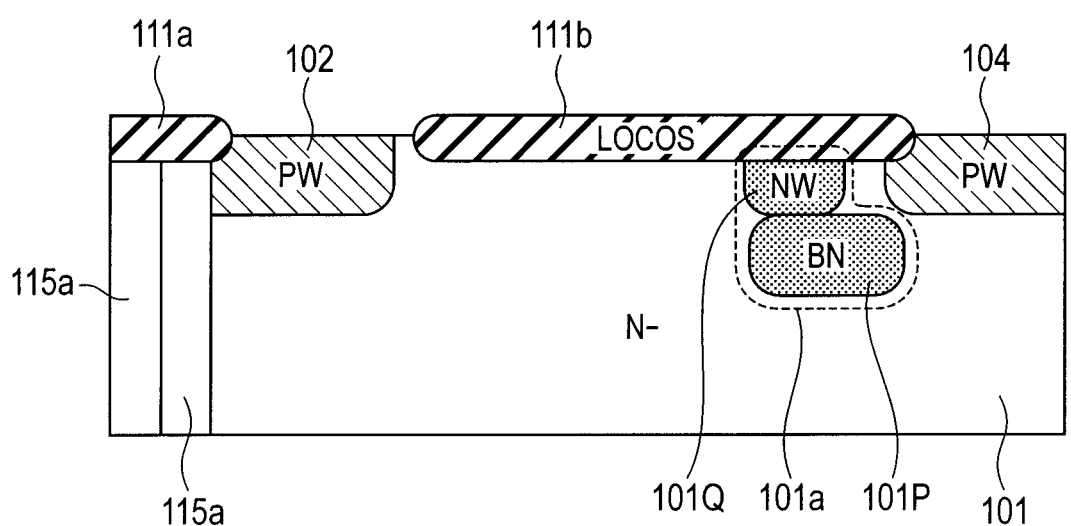
FIG. 15 is a view for explaining a portion of a manufacturing method according to the second embodiment.

Referring to FIG. 14 to FIG. 15, an N well 101Q is formed to the bottom N well 101P on the side of the main semiconductor surface layer. Further, a P well 102 is formed in a device forming region where the lateral IGBT 100 is formed. Further, a P well 104 is formed in a device forming region where the avalanche diode 200 is formed.

Figure 16:
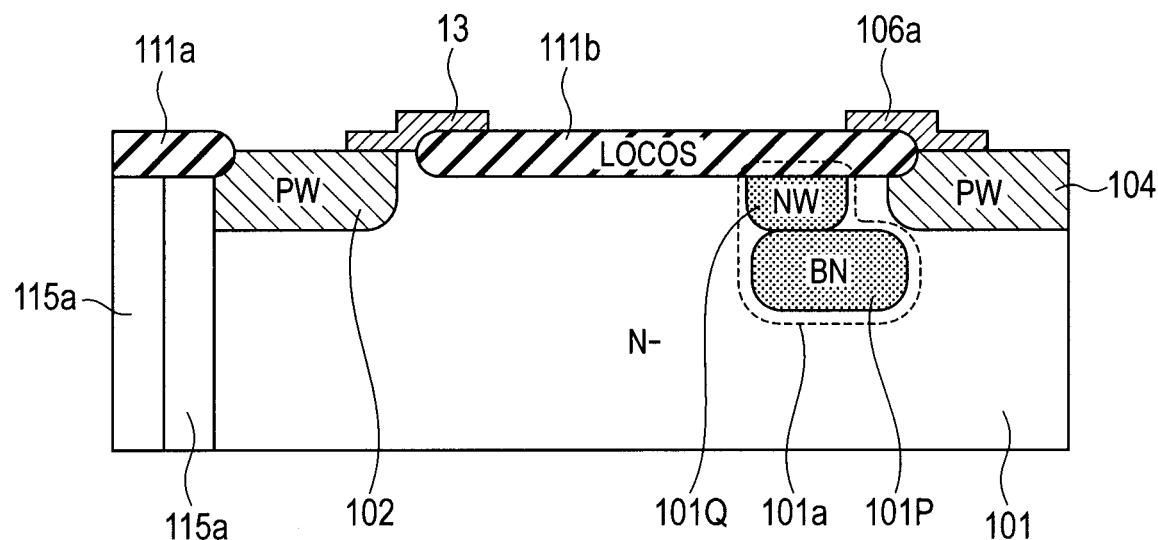
FIG. 16 is a view for explaining a portion of a manufacturing method according to the second embodiment.

Referring to FIG. 16, a gate electrode is formed in a device forming region where the lateral IGBT 100 is formed while interposing a gate insulating film (not illustrated) over the region of the predetermined P well 102. Further in the device forming region where the avalanche diode 200 is formed, a gate electrode 106a is formed while interposing a gate insulating film (not illustrated) over the region of the predetermined P well 104.

Figure 17:
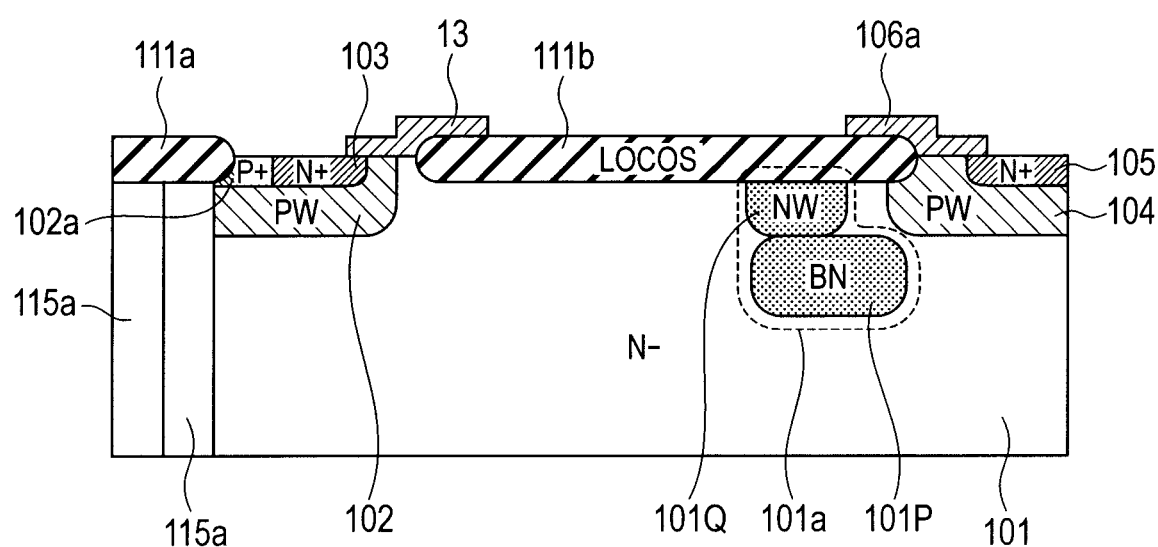
FIG. 17 is a view for explaining a portion of a manufacturing method according to the second embodiment.

Referring to FIG. 17, an N$^+$ diffusion layer 103 and a P$^+$ diffusion layer 102a as an emitter region are formed in the P well 102 in the device forming region where the lateral IGBT 100 is formed. On the other hand, an N+ diffusion layer 105 as a cathode region of the avalanche diode 200 is formed over the P well 104 in the device forming region where the avalanche diode 200 is formed. The cathode region is also the collector region of the lateral IBGT 100.

Figure 18:
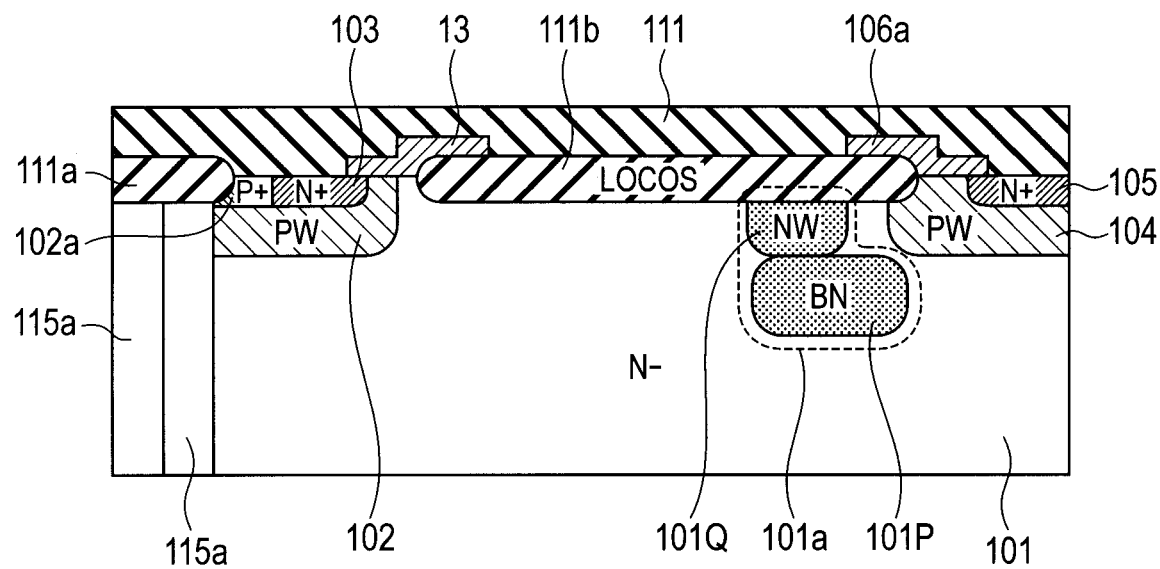
FIG. 18 is a view for explaining a portion of a manufacturing method according to the second embodiment.

Referring to FIG. 18, an interlayer insulating film 111 is formed so as to cover each of the devices formed in the device forming region, and a resist is coated over the insulating film. A predetermined resist mask is formed by applying predetermined photolithographic processing to the resist.

Figure 19:
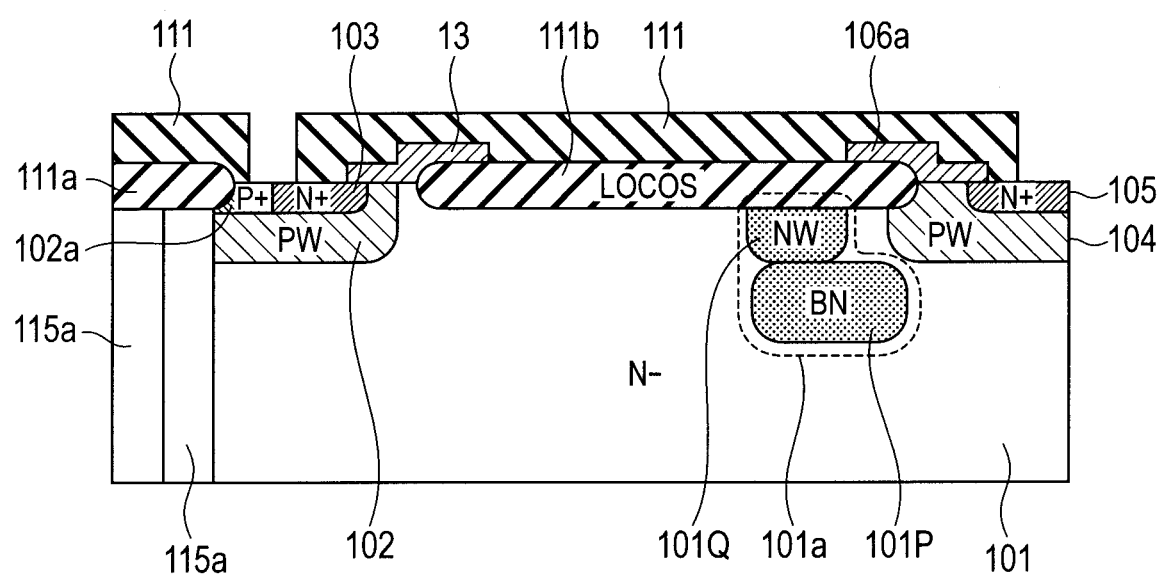
FIG. 19 is a view for explaining a portion of a manufacturing method according to the second embodiment.

Referring to FIG. 19, contact holes are apertured by lithography and etching technique for coupling with the emitter electrode as the emitter region of the lateral IGBT 100 and the cathode electrode as the cathode region of the avalanche diode 200 (collector electrode of the lateral IGBT 100) respectively.

Figure 20:
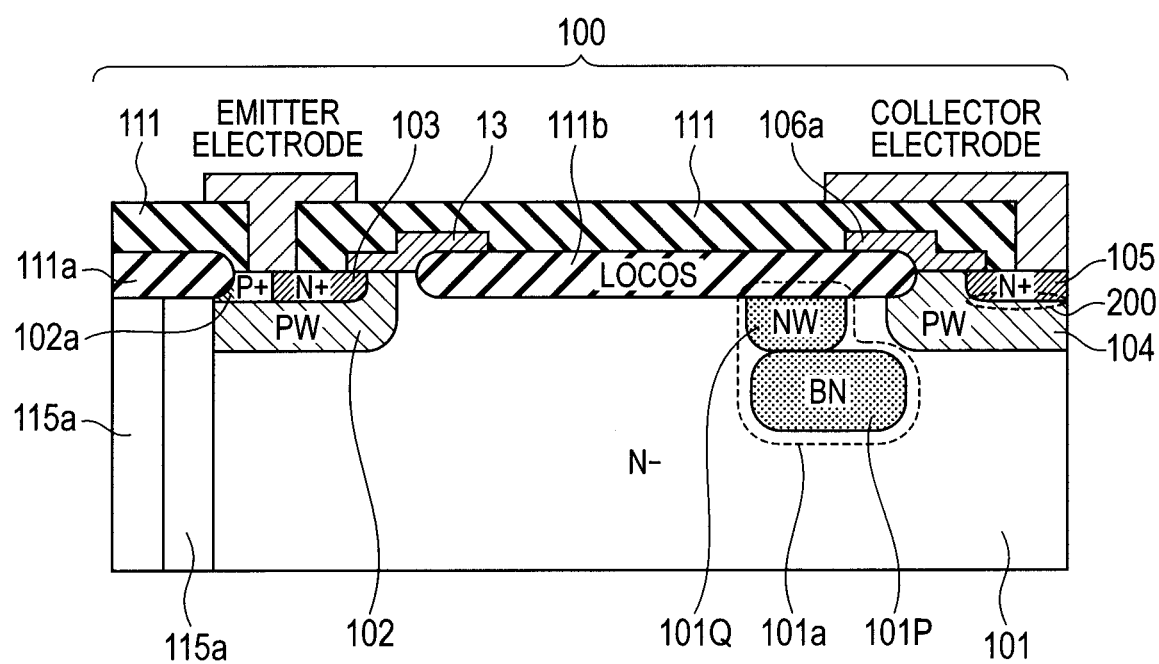
FIG. 20 is a view for explaining a portion of a manufacturing method according to the second embodiment.

Referring to FIG. 20, a metal film is deposited over the interlayer insulating film 111 in the contact holes formed as described above, for example, by a sputtering method, and processed by lithography and etching to form interconnects. Thus, the emitter electrode of the lateral IGBT 100 and the cathode electrode of the avalanche diode 200 (collector electrode of the lateral IGBT 100) can be led out.

As described above, the lateral IGBT 100 including the avalanche diode 200 is formed. In view of the above, increase in the area of the ESD protection circuit 10 which is necessary for the incorporation of the avalanche diode 200 in the N$^+$ diffusion layer 105 as the collector region of the lateral IGBT 100 is only little also due to the effect of sharing the contacts in common, and the necessary area of the ESD protection device can be decreased compared with a case of serially coupling the devices such as GGNMOS.

Figure 21:
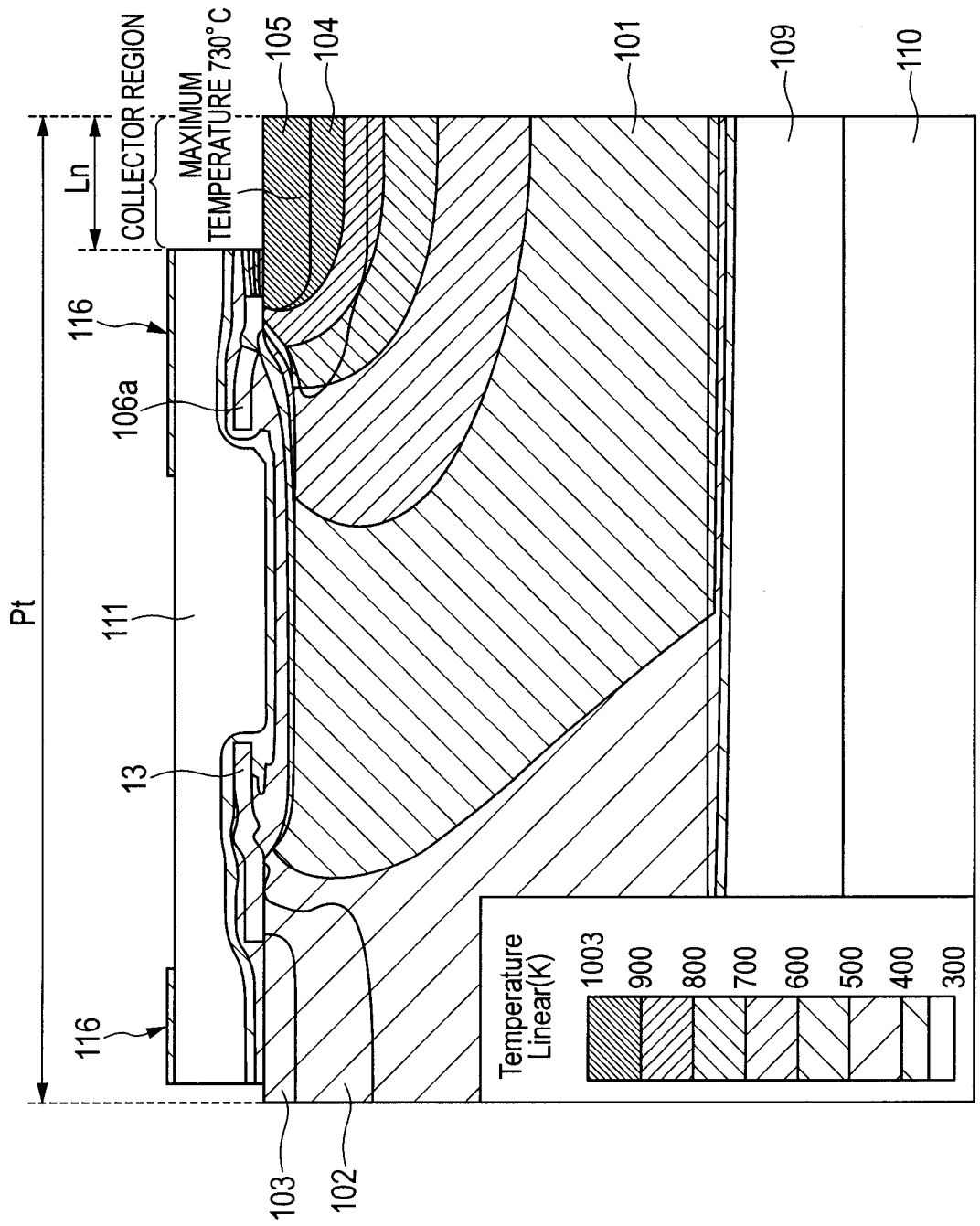
FIG. 21 is a view showing a result of simulation for a temperature distribution in a collector region of the second embodiment in an HBM (Human-Body-Model)
Figure 22:
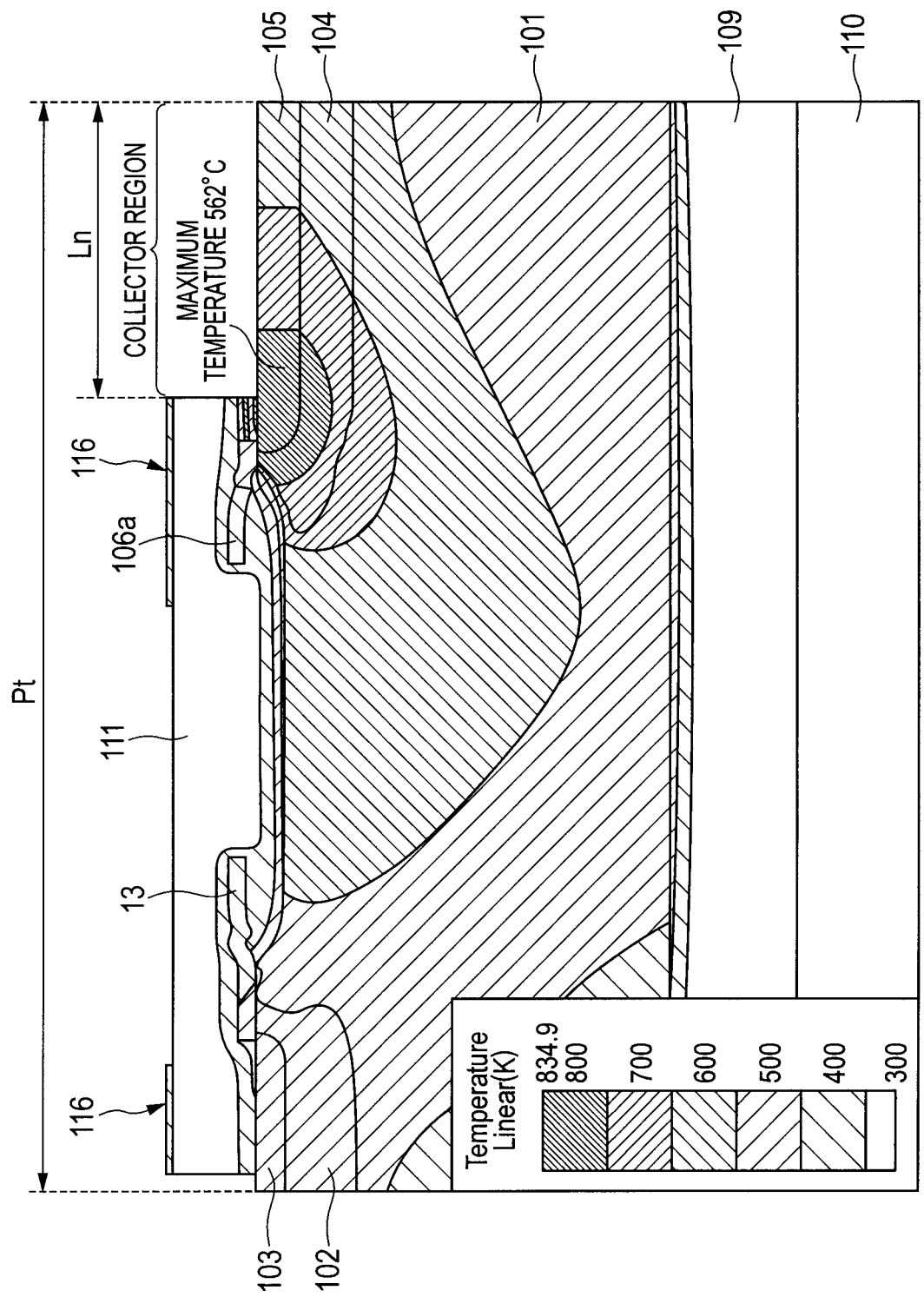
FIG. 22 is a view showing a result of simulation for a temperature distribution in a collector region of the second embodiment in the HBM.
Figure 23:
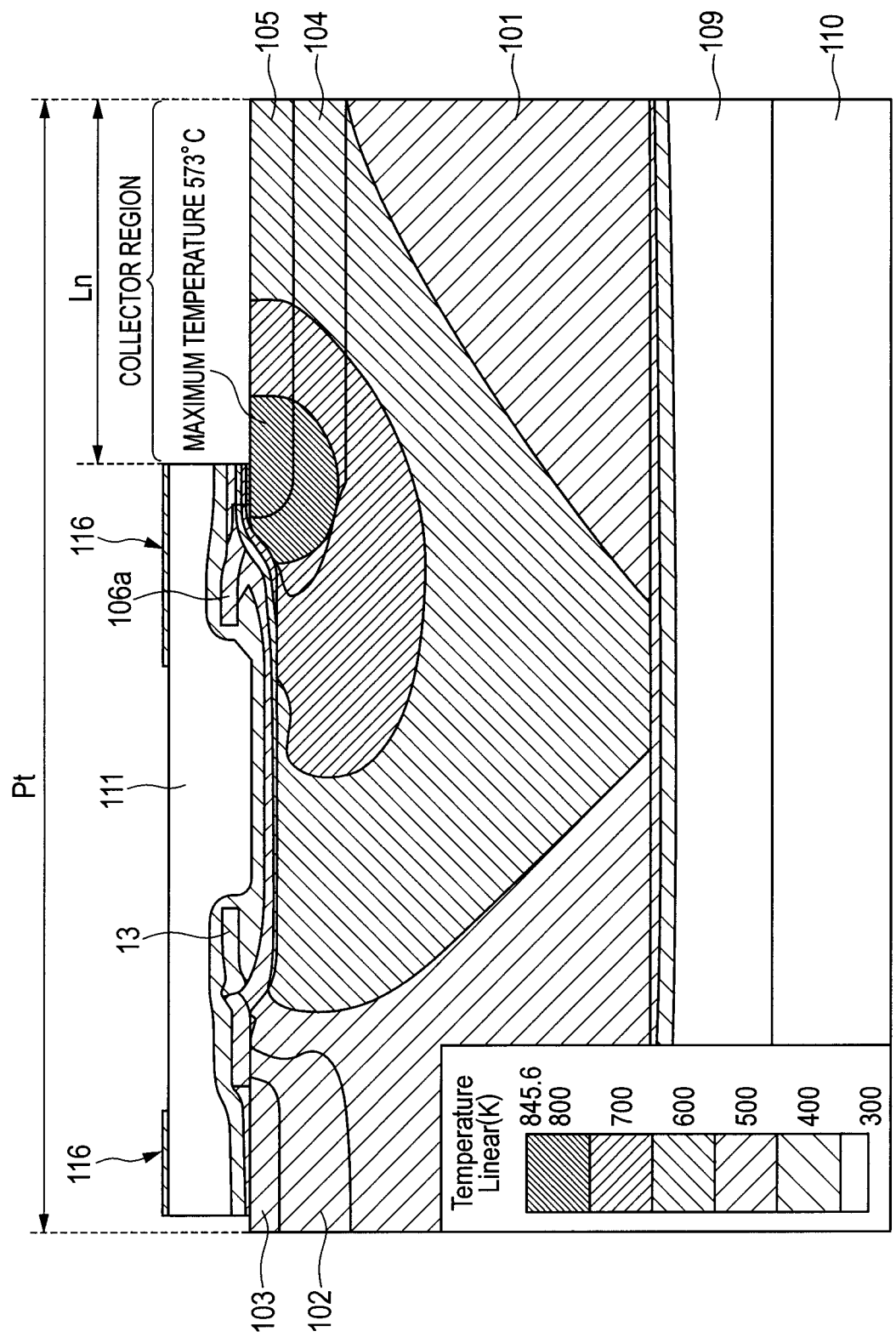
FIG. 23 is a view showing a result of simulation for a temperature distribution in a collector region of the second embodiment in the HBM.

FIG. 21 to FIG. 23 are views showing the result of simulation for the temperature distribution in the collector region of the second embodiment in the HBM.

The premise for the simulation also includes the gate drive circuit 300 using the avalanche diode group 301 for adjusting the protection voltage having a breakdown voltage of 40 V in the ESD protection circuit 10A having an effective area of 10000 μm$^2$. Further, while the device group shown in FIG. 21 to FIG. 23 is a minimum unit for the repetitive structure, the boundary condition is also taken into consideration in the simulation. A serge ESD voltage at 8 kV is applied to the terminal 21 to the ESD protection circuit 10 by using the HBM.

Referring to FIG. 21 to FIG. 23, the width of the N$^+$ diffusion layer 105 (collector region) as the collector region is increased gradually in this order.

Referring to FIG. 21, in a case where the distance from the center of the collector region to the end of the collector region (collector region length Ln) is shorter relative to the distance Pt from the center of the collector region to the center of the emitter region compared with that in FIG. 22 to FIG. 23, since the impurity concentration is high and the extension of the depletion layer is small upon backward bias in the junction of the N$^+$ diffusion layer 105 as the collector region, the current density increases and the heat generation is concentrated to increase the temperature. For example, temperature increase of at about 730° C. is observed in the case of FIG. 21.

On the other hand, as shown in FIG. 22 to FIG. 23, when the collector region length Ln increases relative to the distance Pt from the center of the collector region to the center of the emitter region, the current density is lowered, specifically, the current less flows at a position remote from the channel. That is, even when the collector region length Ln increases, the current density is low and the possibility of temperature increase is small near the center of the region. On the other hand, near the channel (both ends of the collector region), the current density increases and the heat generation is concentrated to increase the temperature.

The maximum temperatures in the collector region in FIG. 22 to FIG. 23 are at about 560° C. and at about 570° C. respectively, and the maximum temperature is lowered compared with that in FIG. 21.

On the other hand, even when the collector region Ln is increased continuously, the maximum temperature is not always lowered when the maximum temperature in FIG. 22 and the maximum temperature in FIG. 23 are compared. Accordingly, the minimum value of the maximum temperature can be set by setting the collector region length Ln to an optimal value. Specifically, when the collector region length Ln is at the optimal value, the maximum temperature of the collector region becomes a minimum value to increase the margin as the ESD protection device.

With respect to the margin, description is to be made for the desirable extent of the ratio between the collector region length Ln and the collector electrode-emitter electrode distance Pt while also considering the relation with the temperature change and the total gate width Wt.

Figure 24:
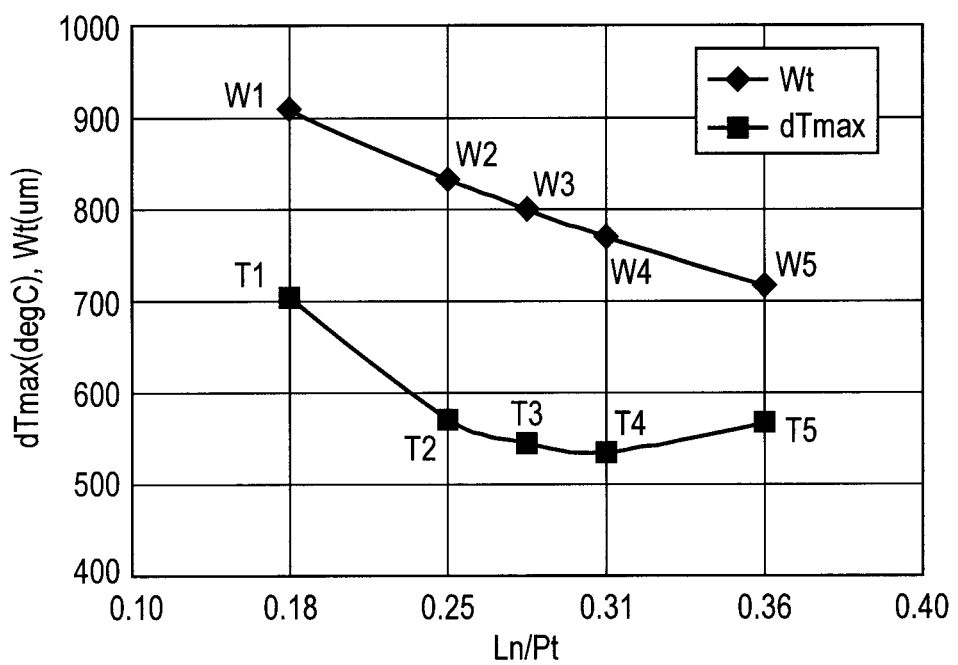
FIG. 24 is a graph for explaining a relation between the ratio of the collector region length Ln to the distance Pt from the center of the collector region to the center of the emitter region, and the maximum temperature (dTmax) and the total gate width (Wt).

FIG. 24 is a graph for explaining the relation between the ratio (Ln/Pt) of the collector region length Ln to the distance Pt from the center of the collector region to the center of the emitter region, and the maximum temperature (dTmax) and the total gate width (Wt).

Referring to FIG. 24, the abscissa represents the collector region length Ln relative to the distance Pt from the center of the collector region to the center of the emitter region in FIG. 7, in which the ordinate represents the maximum temperature (dTmax) (unit: ° C.) and the total gate width (Wt) (unit: μm).

As the collector region ratio increases, the total gate width Wt decreases. Specifically, along with increase in the collector region from W1 to W5, the total gate width Wt also decreases substantially at a constant slope. On the other hand, for the change of the maximum temperature, the maximum temperature decreases along with increase in the ratio of the collector region. That is, the heat generating temperature is about 530(° C.) at Ln/Pt of about 0.31 as the stage T4 to show the minimum value for the maximum temperature. Subsequently, as the ratio of the collector region increases, the maximum temperature increases up to the stage T5.

Accordingly, the current density is lowered and the maximum temperature can be lowered by defining the collector region length Ln about from 1/4 (T2 in FIG. 24) to 1/2.8 (T5 in FIG. 24) relative to the distance Pt from the center of the collector region to the center of the emitter region. Thus, the margin for the temperature characteristic of the ESD protection circuit 10 is improved and, consequently, a voltage withstanding margin for protecting the protected device 400 against ESD surge voltage is also improved.

As has been described above, the area and the manufacturing cost of the ESD protection circuit can be decreased and the device destruction can be prevented also in a case where the DC current is superimposed by further providing the avalanche diode by the PN junction in the lateral IGBT on the side of the collector region. High performance ESD voltage withstanding can be ensured without increasing the chip area of the semiconductor device and the performance of the semiconductor device can be improved.

It should be construed that all of the preferred embodiments described herein are any illustrative but not limitative. The range of the present invention is shown not by the description described above but by the scope of the claims, and includes all changes or modifications for the meanings and ranges equivalent with those of the claims.

What is claimed is:

1. A semiconductor device having a semiconductor layer of a first conduction type formed on the main surface of a semiconductor substrate, wherein
    the semiconductor layer includes a lateral IGBT and an avalanche diode,
    the lateral IGBT has a collector region of the first conduction type formed from the surface of the semiconductor layer in the direction of depth,
    an emitter region of the first conduction type formed from the surface of the semiconductor layer in the direction of depth,
    a first well region of a second conduction type formed in the semiconductor layer so as to surround the emitter region from the peripheral direction and the bottom, and
    a first gate electrode formed over the first well region situated between the semiconductor layer and the emitter region,
    the avalanche diode has
        the collector region; and
        a second well region of the second conduction type formed in the semiconductor layer so as to surround the collector region from the peripheral direction and the bottom,
    the semiconductor device further has a buffer region of the first conduction type formed in the vicinity of the second well region; and
    the distance from the center of the collector region to the end of the collector region is from 1/4 to 1/2.8 of a distance from the center of the collector region to the center of the emitter region in a cross sectional view of the semiconductor device in a direction along the gate length of the lateral IGBT.

2. The semiconductor device according to claim 1, wherein the buffer region is formed in a region nearer to the collector region than the emitter region.

* * * * *